(12) United States Patent
Hsu

(10) Patent No.: US 6,475,012 B1
(45) Date of Patent: Nov. 5, 2002

(54) DEVICE FOR CPU SOCKET ACTUATION

(75) Inventor: Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/025,413

(22) Filed: Dec. 18, 2001

(51) Int. Cl.⁷ .......................................... H01R 13/625
(52) U.S. Cl. ...................................................... 439/342
(58) Field of Search ................................. 439/342, 159

(56) References Cited

U.S. PATENT DOCUMENTS

| | | | | |
|---|---|---|---|---|
| 6,071,140 A | * | 6/2000 | McHugh et al. | ............ 439/342 |
| 6,171,128 B1 | * | 1/2001 | Huang et al. | ................ 439/342 |
| 6,210,197 B1 | * | 4/2001 | Yu | ............................. 439/342 |
| 6,250,941 B1 | * | 6/2001 | Huang et al. | ............... 439/342 |
| 6,280,224 B1 | * | 8/2001 | Huang | ........................ 439/342 |
| 6,296,506 B1 | * | 10/2001 | Mizumura et al. | .......... 439/342 |
| 6,296,507 B1 | * | 10/2001 | Huang | ........................ 439/342 |
| 6,325,655 B1 | * | 12/2001 | Noda et al. | ................. 439/342 |
| 6,338,640 B1 | * | 1/2002 | Lin | ............................. 439/342 |

* cited by examiner

Primary Examiner—Gary F. Paumen
(74) Attorney, Agent, or Firm—Wei Te Chung

(57) ABSTRACT

An actuation device comprises a frame with an actuator. The frame is substantially U-shaped and has at least one claw portion and a actuation portion formed thereon and extending from edges of the frame. The actuation portion extends in a direction far from the CPU, and the actuation portion has a recess for engaging directly with a screw driver when the CPU is actuated.

1 Claim, 5 Drawing Sheets

DEVICE FOR CPU SOCKET ACTUATION

BACKGROUND OF THE INVENTION

1. Field of the invention

The present invention relates to an actuation device for a central processing unit (CPU), especially to an actuation device which can protect the CPU from being damaged during the CPU actuation process.

2. Description of the prior art

Referring to FIG. 8, a prior art connector 8 for electrically connecting a CPU 7 with a printed circuit board (PCB) is shown. The connector 8 comprises a housing 82, a cover 81 having a plurality of holes formed therein and being slidable on the housing 82, a pair of ear portions 822 formed on opposite sides of the housing 82 and having recesses 821 defined therein. Conventionally, a plurality of pins formed on the CPU 7 for being inserted in the holes of the cover 81 to electrically connect to the contacts secured in the housing 82 are engaged with the contacts by using a screw driver 91 which is inserted in the recess 821 to directly actuate the CPU 7. However, because the packaging material of the CPU is fragile, the CPU 7 tend to be damaged under direct impact by the screw driver.

Accordingly, a frame 92 for cooperating with the screw driver 91 is provided. The frame 92 is positioned on the CPU 7. A plurality of claws 923 extend from two opposite sides of the frame 92 for clipping sides of the CPU 7.

Two engaging portion 924 extend horizontally for engaging with the screw driver 91 during the CPU actuation process.

However, when the actuating process is finished, because the claws 923 clip two sides of the CPU 7, a user further needs to remove the frame 92 from the CPU 7. This will decrease the efficiency of actuation operation.

Accordingly, an improved device is required to overcome the above disadvantage of conventional CPU actuation frame 92.

SUMMARY OF THE INVENTION

An object of the present invention is to provide an actuation device for a CPU with increased efficiency of actuation operation.

To achieve the above object, an electrical connector assembly in accordance with a preferred embodiment of the present invention comprises an electrical connector which can electrically engage with the CPU and the connector forming an ear portion at a side thereof. The central processing unit (CPU) has a top surface, a bottom surface and a side wall between the top surface and the bottom surface, the CPU being slidably mounted on the connector beside the ear portion. An actuation device positioned on the CPU comprises a frame located on the top surface of the CPU, a plurality of claw portions extending substantially perpendicularly from edges of the frame along the side wall of the CPU toward the ear portion, and an actuation portion which is formed adjacent to the claw portion and extending from the edge of the frame in a direction from the CPU to the ear portion, wherein a recess is defined in the actuation portion for directly engaging with an actuating tool to drive the CPU to move over the connector, and when the actuating tool is brought away, the frame can be brought away from the CPU afterwards.

Other objects, advantages and novel features of the present invention drawn from the following detailed description of preferred embodiments of the present invention with attached drawings, in which:

DESCRIPTION OF PREFERRED EMBODIMENTS OF THE INVENTION

Figure 1:
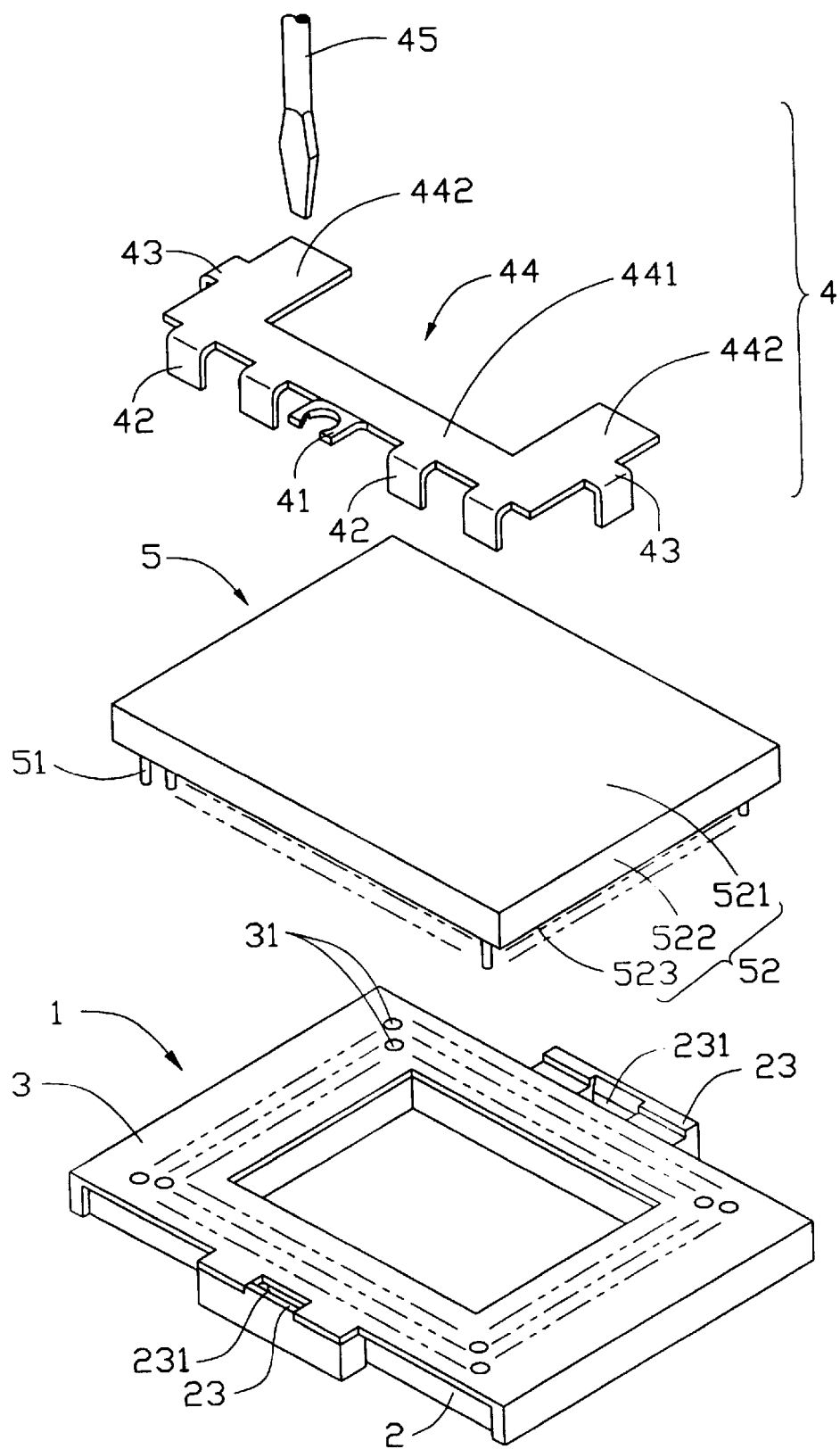
FIG. 1 is an exploded view of an electrical connector assembly in accordance with a preferred embodiment of the present invention together with a FIGS. 2, 3 and 4 are assembled views of the electrical connector assembly and the tool of FIG. 1 showing progressive stages of engagement the electrical connector assembly and the tool.

Reference will now be made to the drawing figures to describe the present invention in detail.

Figure 2:
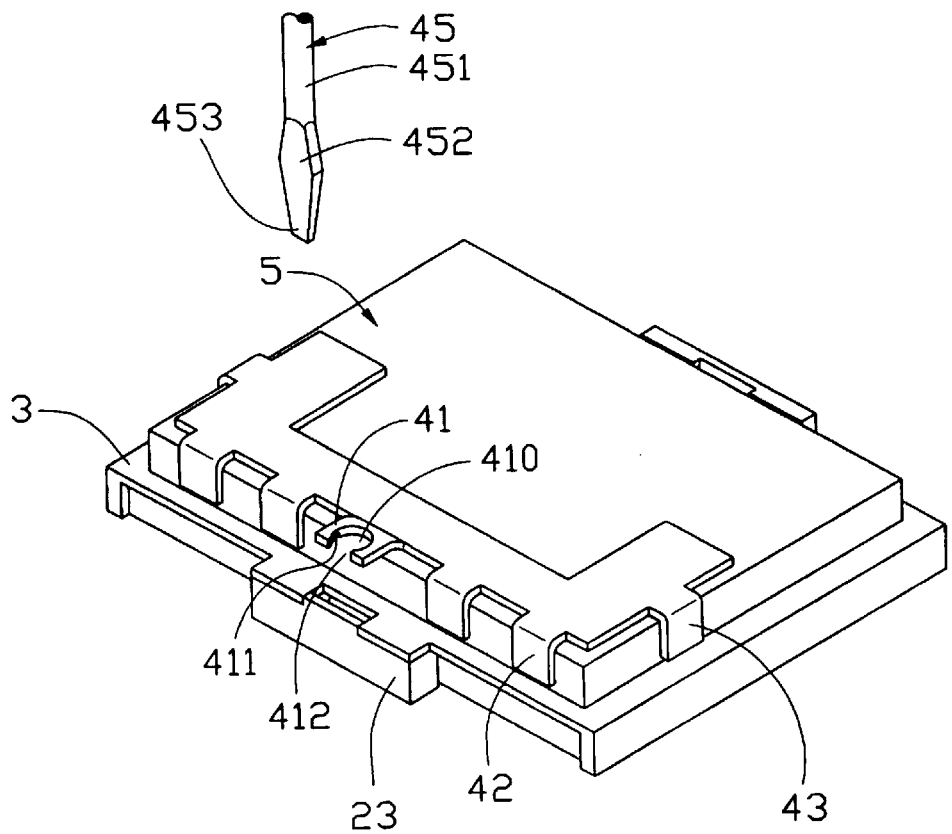
Figure 3:
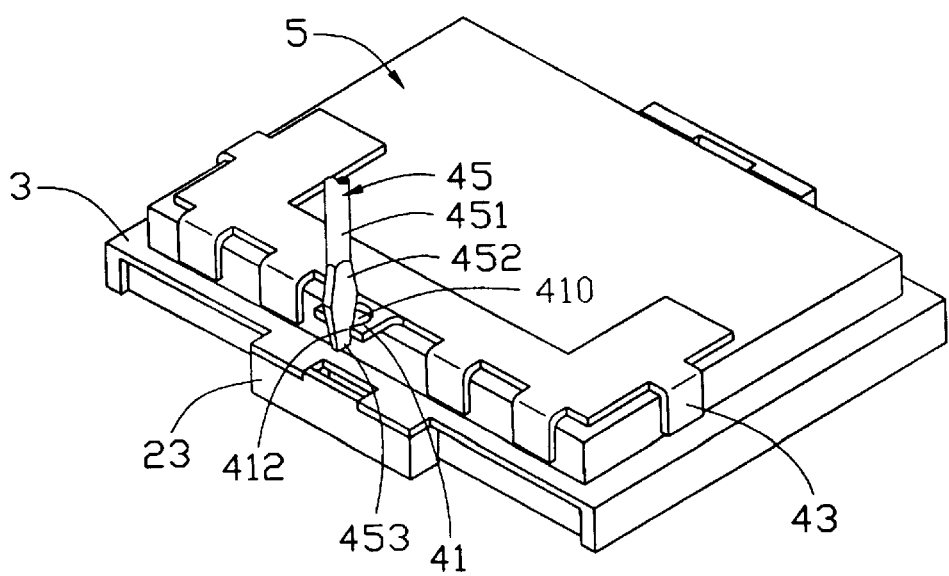
Figure 4:
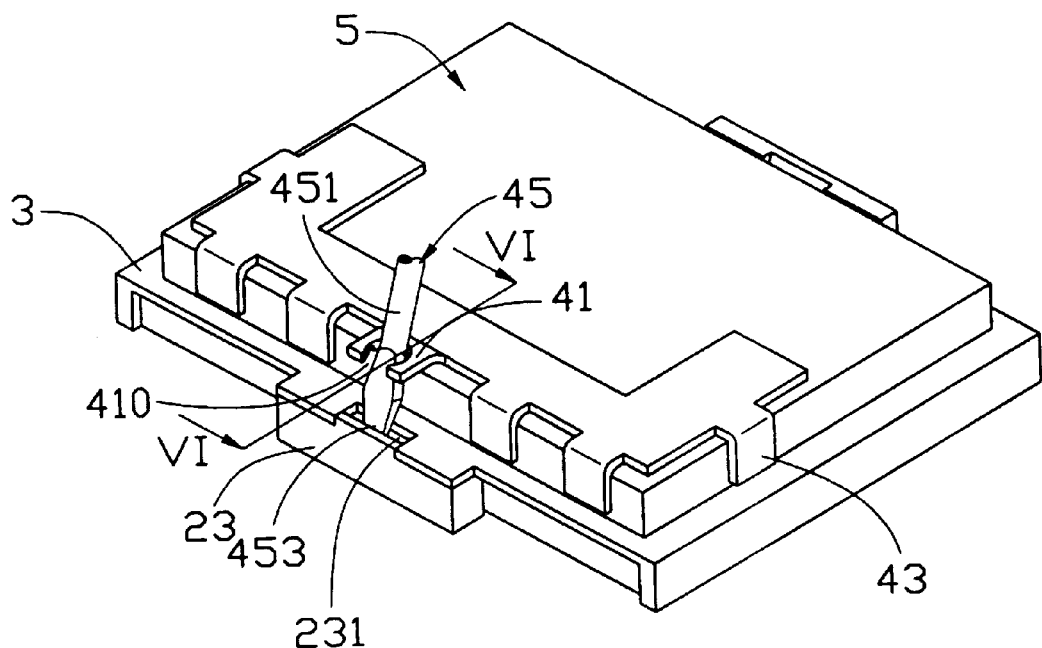
Figure 5:
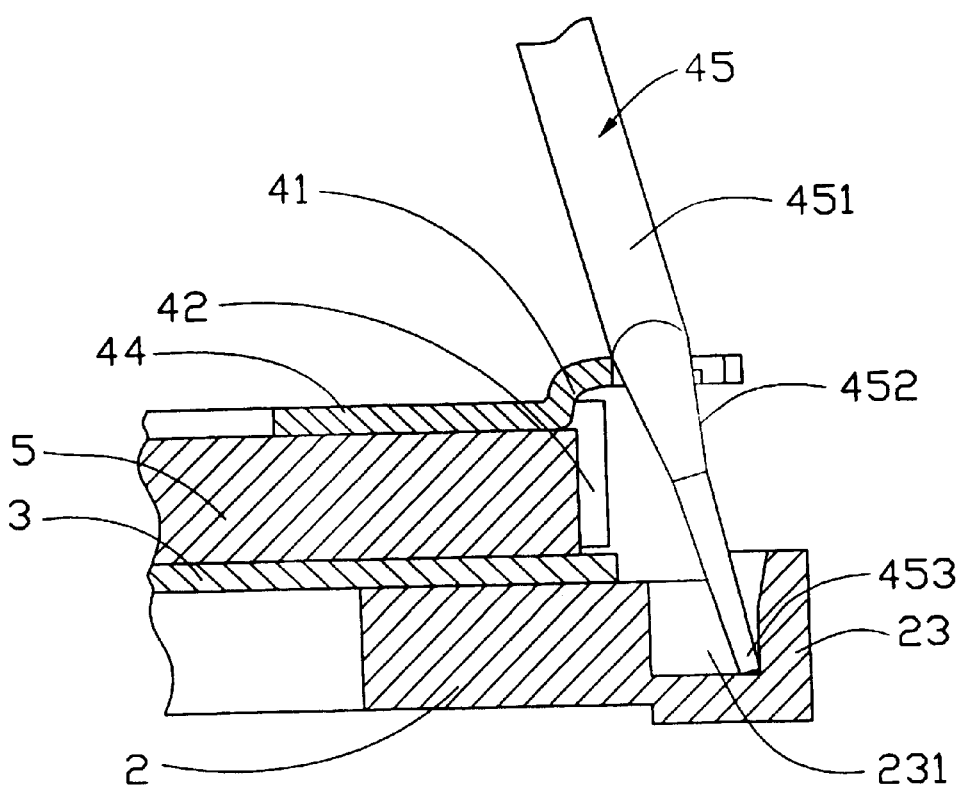
FIG. 5 is a cross sectional view taken along line 5—5 of FIG. 4.

As shown in FIGS. 1 and 2, a CPU 5 positioned on a socket 1 for engaging with an actuation device 4 comprises a substrate 52, a top surface 521 and a bottom surface 523. A plurality of pins 51 extend from the bottom surface 523 and a side wall 522 is defined between the top surface 521 and the bottom surface 523. The socket 1 comprises an insulative housing 2 with a plurality of contact receiving passages (not shown) defined therein. A cover 3 can slide on the housing 2 and has a plurality of holes 31 defined therein. The housing 2 further comprises two ear portions 23 with a respective notch 231 opened therein.

The actuation device 4 in according to the present invention comprises a frame 44 and a screw driver 45. The frame 44 is stamped from a metal sheet as an inverted U-shaped configuration, which comprises a base portion 441, and two arm portions 442 perpendicularly extending from the opposite sides thereof over the top surface 521 of the housing 52 of the CPU 5 for preventing the frame 44 from rotating during the actuation process. The frame 44 comprises claw portions 42, clip portions 43 and an actuation portion 41. The claw portions 42 extend downwardly from the base portion 441 along the side wall 522 of the CPU 5 for engaging closely therewith. Clip portions 43 are defined on edges of the arm portions 442 and extend downwardly therefrom along the side wall 522 of the CPU 5. The clip portions 43 are perpendicular to the claw portions 42. The actuation portion 41 extends far from the CPU 5 for engaging directly with an actuating tool such as a screw driver 45 and comprises a recess 410 defined therein. The recess 410 has an opening 412, and two slots 411 formed in the bottom surface of the recess 410. The screw driver 45 comprises a shaft portion 451 and a head portion 452. The shaft portion 451 can rotate in the recess 410 and engage with the recess 410 to provide engagement point during actuation process. The head portion 452 has a width which is larger than a diameter of the recess 410 for engaging with the slots 411 to confine the screw driver 45 to rotate in the recess 410. The head portion further has an end portion 453. Thickness of the end portion 453 is smaller than width of the opening 412, so the screw driver 45 can be moved into the recess 410 through the opening 412 along side direction, and then the end portion 453 can be inserted into the notch 231 to form fulcrum 251 during actuation process.

As shown in FIGS. 2, 3, 4 and 5, in actuation process, initially, the CPU 5 is positioned on the socket 1 with the pins 51 passing through the holes 31 of the cover 3 and then inserted in the contact receiving passages (not shown). Then, the frame 44 is disposed on the CPU 5 with the claw portions 42 and the clip portions 43 engaged with the side walls 522 of the CPU 5, and at the same time the actuation portion 41 is located upon the notch 231 of the ear portion 23 of the housing 2. Initially, end portion 453 of the head portion 452 of the screw driver 45 is moved along side direction into the recess 410, then the screw driver 45 is inserted downwardly to a predetermined position, finally the screw driver is rotated 90 degrees with the end portion 453 being inserted in the notch 231 to form a fulcrum. When a force is loaded to the actuation portion 41 of the screw driver 45, a force can be created and the pins 51 of the CPU 5 can be easily pushed to be electrically connected to contacts of the socket 1.

Figure 6:
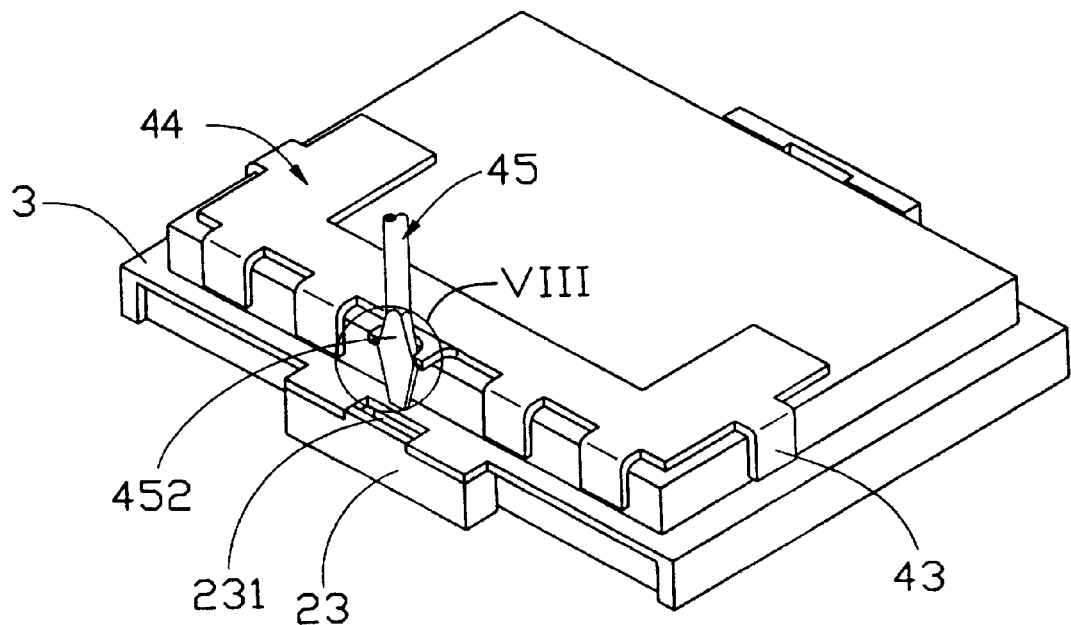
FIG. 6 is an assembled view of the electrical connector assembly tool of FIG. 1 showing a portion of the electrical connector assembly being cut away.
Figure 7:
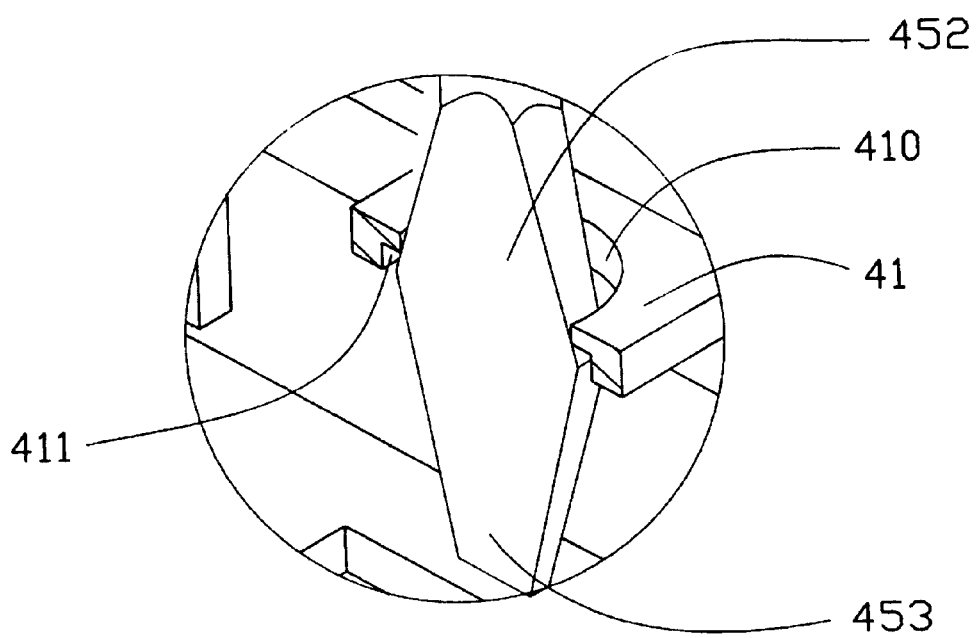
FIG. 7 is a partially enlarged view of circled portion VII of FIG. 6.
Figure 8:
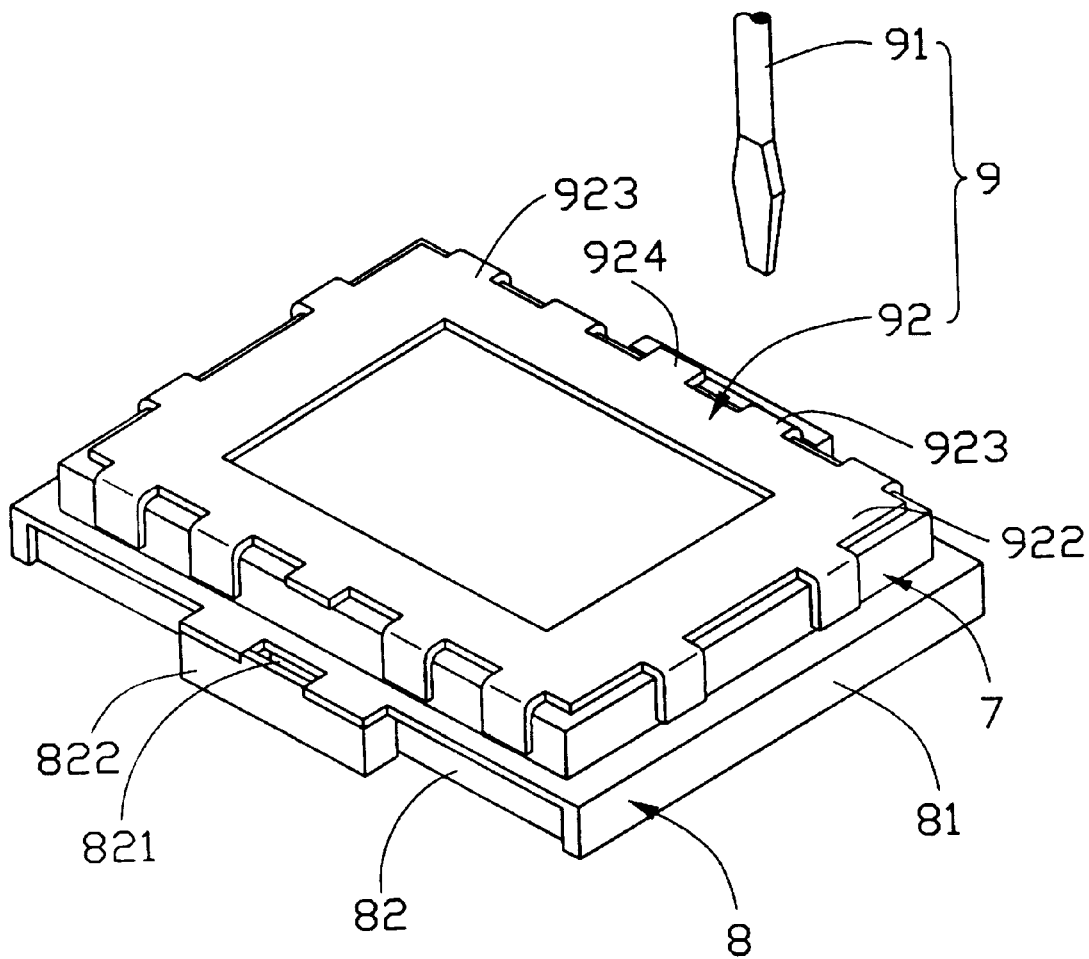
FIG. 8 is an assembled view of a conventional electrical connector assembly and a tool.

Referring to FIGS. 6 and 7, when the actuation process is finished, the screw driver 45 is pulled up with the head portion 452 engaging with the of the actuation portion 41, whereby the frame 44 is separated and taken om the CPU 5.

Although the present invention has been described with reference to particular embodiments, it is not to be construed as being limited thereto. Various alterations and modifications can be made to the embodiments without in any departing from the scope or spirit of the present invention as defined in the appended claims.

What is claimed is:

1. A connector assembly, comprising:

an electrical connector forming an ear portion at a side thereof;

a central processing unit (CPU) having a top surface, a bottom surface and a side wall between the top surface and the bottom surface, the CPU being mounted on the connector beside the ear portion; and an actuation device positioned on the CPU and comprising a frame located on the top surface of the CPU, a plurality of claw portions extending substantially perpendicularly from edges of the frame along the side wall of the CPU toward the ear portion, and an actuation portion formed adjacent to the claw portion and extending from the edge of the frame in a direction from the CPU to the ear portion, wherein a recess is defined in the actuation portion for directly engaging with an actuating tool to drive the CPU to move over the connector, and when removing the actuating tool, the frame is urged away from the CPU simultaneously, wherein the frame comprises a base portion with two arm portions extending from opposite sides thereof;

wherein the base portion and the arm portions are in the same plane;

wherein the frame has at least one clip portion which extends from an edge of the frame and is perpendicular to the claw portion for positioning the actuation device securely on the CPU;

wherein the actuating tool is a screwdriver with a shaft portion and a head portion formed thereon;

wherein slots are opened in the bottom surface of the actuation portion for confining the head portion of the screwdriver within the recess;

wherein the recess has an opening with a width larger than a thickness of the head portion of the screw driver.

* * * * *